US010439617B2

(12) United States Patent
Neidengard

(10) Patent No.: US 10,439,617 B2
(45) Date of Patent: Oct. 8, 2019

(54) BIDIRECTIONAL GRAY CODE COUNTER

(71) Applicant: Intel Corporation, Santa Clara, CA (US)

(72) Inventor: Mark L. Neidengard, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 634 days.

(21) Appl. No.: 15/146,483

(22) Filed: May 4, 2016

(65) Prior Publication Data

US 2017/0324415 A1    Nov. 9, 2017

(51) Int. Cl.
*H03K 23/00* (2006.01)
*H03M 7/16* (2006.01)

(52) U.S. Cl.
CPC ............. *H03K 23/005* (2013.01); *H03M 7/16* (2013.01)

(58) Field of Classification Search
None
See application file for complete search history.

(56) References Cited

U.S. PATENT DOCUMENTS

| | | | | |
|---|---|---|---|---|
| 5,164,968 A * | 11/1992 | Otto | ...................... | H03K 23/005 377/34 |
| 5,754,614 A * | 5/1998 | Wingen | ................ | H03K 23/005 341/97 |
| 6,314,154 B1 * | 11/2001 | Pontius | ................ | H03K 23/005 377/16 |
| 7,991,104 B1 * | 8/2011 | Dahan | ................... | H03K 23/005 377/34 |
| 8,867,694 B1 * | 10/2014 | Gupta | ................... | H03K 23/005 377/118 |
| 9,455,717 B2 * | 9/2016 | Dahan | ................... | H03K 23/542 |
| 2005/0129167 A1 * | 6/2005 | Heimbigner | ......... | H03K 19/215 377/34 |
| 2008/0224904 A1 * | 9/2008 | Fujimura | ............. | H03K 23/005 341/63 |
| 2015/0244376 A1 * | 8/2015 | Liu | ....................... | H03K 23/005 327/156 |

* cited by examiner

*Primary Examiner* — Tuan T Lam
(74) *Attorney, Agent, or Firm* — Schwabe, Williamson & Wyatt, P.C.

(57) ABSTRACT

Apparatuses, systems and methods associated with bidirectional Gray code counter design are disclosed herein. In embodiments, a bidirectional Gray code counter may include a sequential logic element to store a Gray code value and logic circuitry. The logic circuitry may be to determine, based on a bidirectional indicator signal, whether to increment or decrement the Gray code value update, through performance of an increment or a decrement of the Gray code value based on the determination of whether to increment or decrement the Gray code value, the Gray code value to be a sequential Gray code value and replace the Gray code value stored in the sequential logic element with the updated Gray code value. Other embodiments may be described and/or claimed.

25 Claims, 6 Drawing Sheets

BIDIRECTIONAL GRAY CODE COUNTER

TECHNICAL FIELD

The present disclosure relates to the field of electronic circuits. More particularly, the present disclosure relates to a bidirectional Gray code counter.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Legacy bidirectional counter circuitry focuses on providing bidirectional binary counters for simplicity and ease of design. However, the bidirectional binary counters present the disadvantages of high levels of energy consumption and lower possible counter frequencies due to multiple bits being changed by the counter on each increment or decrement. Further, the bidirectional binary counters require greater physical area for components to implement the bidirectional binary counters.

With the advancement and growth of smaller computer devices and mobile computer devices, reduced energy consumption and limitation of physical area required by electronic components within the computer devices have become highly desired. For this reason, such devices as cell phones, personal digital assistants, smart watches and other similar devices may benefit from bidirectional counters that consume less power and require less space for implementation.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
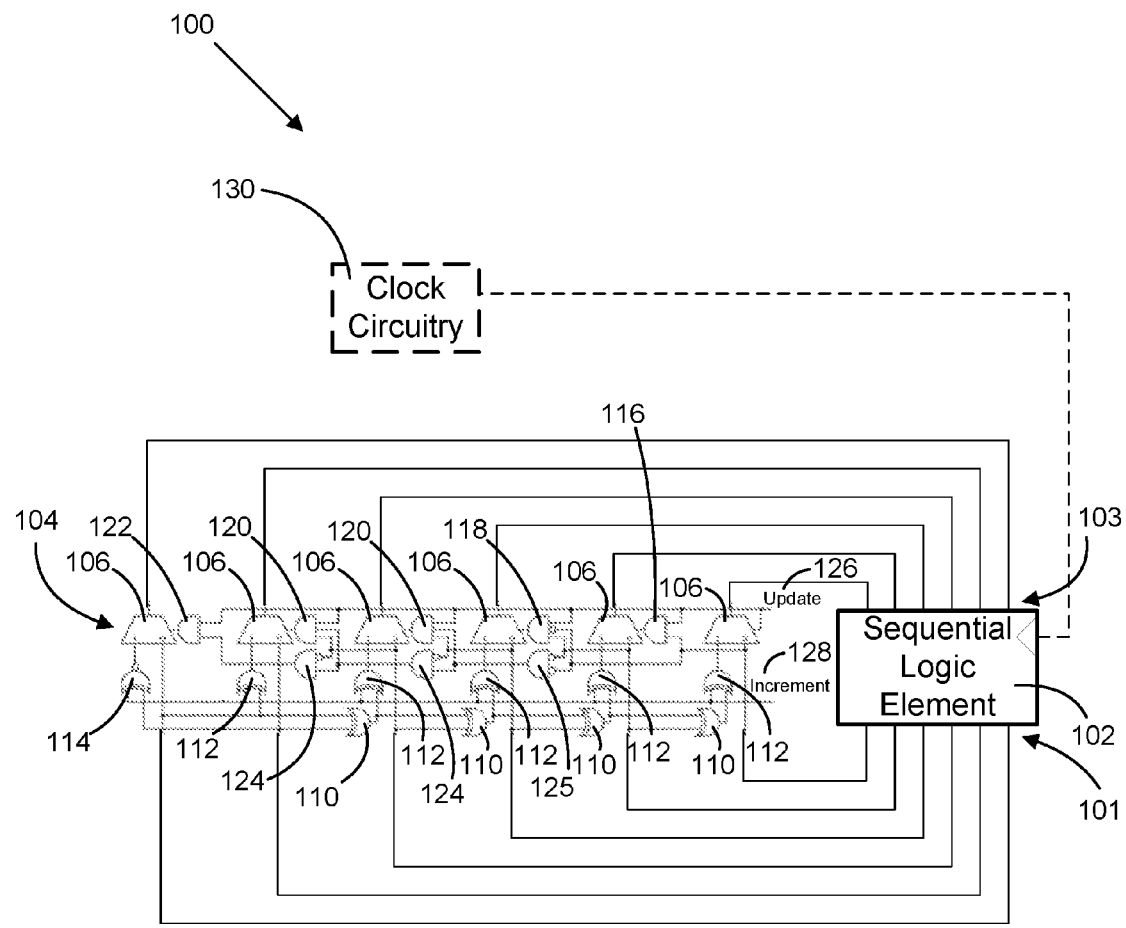
FIG. 1 illustrates an example bidirectional Gray code counter, according to various embodiments.

Apparatuses, systems and methods associated with bidirectional Gray code counter design are disclosed herein. In embodiments, a bidirectional Gray code counter may include a sequential logic element to store a Gray code value and logic circuitry. The logic circuitry may determine, based on a bidirectional indicator signal, whether to increment or decrement the Gray code value and update, through performance of an increment or a decrement of the Gray code value based on the determination of whether to increment or decrement the Gray code value, the Gray code value to be a sequential Gray code value and replace the Gray code value stored in the sequential logic element with the updated Gray code value.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, the terms "logical one" and "high state" may refer to a high logical state, which may include a digital value of one, 5 volts, 2.3 volts, and/or any other value understood by one having ordinary skill in the art to constitute a logical one or logical high state in logic circuitry. The terms "logical zero" and "low state" may refer to a low logical state, which may include a digital value of zero, 0 volts, ground, and/or any other value understood by one having ordinary skill in the art to constitute a logical zero or logical low state in logic circuitry. Additionally, it is to be understood that in some embodiments, the operations and/or features associated with a "logical one" and/or "high state" may be transposed with the operations and/or features associated with a "logical zero" and/or "low state," such that operations and/or features described throughout this disclosure being associated with a "logical one" and/or "high state" may be associated with a "logical zero" and/or "low state" in these embodiments, and vice versa.

Throughout this disclosure, symbols $g_N$ (or similar notation) are utilized in referring to bit positions within a Gray code value and/or binary value. It is to be understood that N refers to a bit location within the Gray code value and/or binary value of g. Accordingly, the Gray code value and/or binary value may be represented as $(g_{N-1}, g_{N-2}, g_{N-3}, \ldots g_2, g_1, g_0)$, wherein N is equal to the number of bits within the Gray code value and/or binary value. In some embodiments, $g_{N-1}$ may be referred to as the most significant bit of the value, and $g_0$ may be referred to as the least significant bit of the value. Further, the term "greater significance" (or similar terms) is to be understood to refer to bit positions closer to the most significant bit and "less significance" is to be understood to refer to bit positions closer to the least significant bit. For example, bits with greater significance than bit $g_3$ includes bits from $g_4$ to $g_{N-1}$ and bits with less significance than bit $g_3$ includes bits $g_2$, $g_1$, and $g_0$.

Throughout this disclosure, the terms "Gray code value" and "Gray code format" are utilized to refer to values and/or formatting associated with Gray code as known to one having ordinary skill in the art of electrical engineering. Gray code refers to a bit-based numeral system where successive values in the numeral system differ by a single bit. A non-exclusive list of types of Gray codes includes binary reflected Gray code, reflected binary code, thermometer style Gray code, n-ary Gray code, balanced Gray code, monotonic Gray code, Beckett-Gray code, snake-in-the-box code, single-track Gray code, and two-dimensional Gray code.

Legacy bidirectional Gray code counters have been developed to address some disadvantages of legacy binary Gray code counters. However, due to the complexity involved in counting in Gray code, the legacy bidirectional Gray code counters convert the Gray code into binary code to increment or decrement and convert the resultant binary code back into Gray code after performing the increment or decrement operation. Additionally, these legacy bidirectional Gray code counters utilized at least two sequential elements for storing the count, one for storing the Gray code count and one for storing the binary count when performing the increment or decrement operation. While these legacy bidirectional Gray code counters improved the amount of energy consumption and physical area for implementation of the design, there was still room for improvement in these areas. Further, due to the necessity of converting from Gray code into binary code and back to Gray code to perform the increment or decrement operation, the legacy bidirectional Gray code counters were limited to lower frequencies than the legacy bidirectional binary counters.

The bidirectional Gray code counters described throughout this disclosure may provide many advantages over legacy bidirectional binary counters and legacy bidirectional Gray code counters. An advantage may include the possibility of achieving a higher maximum count frequency that may be due to a single bit being transitioned with each increment and/or decrement, and/or the lack of conversion between Gray code and binary during the increment and/or decrement operations. Another advantage may include lower average energy consumption that may be due to the single bit being transitioned with each increment and/or decrement, and/or the ability to utilize a single sequential logic element to store the Gray code value rather than the multiple sequential logic elements necessary with the transition between Gray code and binary values. Yet another advantage may include less physical area utilized by the bidirectional Gray code counter due to fewer circuit components and/or logic gates to implement the design. These are only a few of the advantages of the bidirectional Gray code counters described throughout this disclosure, and it should be understood that the advantages of these Gray code counters are not limited to the advantages listed.

FIG. 1 illustrates an example bidirectional Gray code counter 100, according to various embodiments. In some embodiments, the Gray code counter 100 may count in binary reflected Gray code. The bidirectional Gray code counter 100 may include a sequential logic element 102 to store a Gray code value of the bidirectional Gray code counter 100. The sequential logic element 102 may include registers, flip-flops, latches, other electrical components capable of storing the Gray code value, or some combination thereof.

The sequential logic element 102 may store a current Gray code value. The sequential logic element 102 may include a number of outputs 101 corresponding to a number of bits in the Gray code value. The number of outputs 101 of the sequential logic element 102 may have a one-to-one ratio with the number of bits in the Gray code value. The outputs 101 may include an output corresponding to a most significant bit (MSB) position (also referred to as the $g_{N-1}$, where the length of the Gray code value is equal to N) of the Gray code value, an output corresponding to a least significant (LSB) position (also referred to as the $g_0$ position) of the Gray code value, and/or one or more outputs corresponding to bit positions of Gray code value that have significance levels between the MSB and the LSB. Each of the outputs 101 of the sequential logic element 102 may be utilized for transmitting a bit of the Gray code value and the sequential logic element 102 may maintain each of the outputs 101 at an output logic level and/or voltage corresponding to the corresponding bit of the Gray code value.

The sequential logic element 102 may include a number of inputs 103 corresponding to the number bits in the Gray code value. The number of inputs 103 may have a one-to-one ratio with the number of bits in the Gray code value. The inputs 103 may include an input corresponding to a MSB position of the Gray code value, an input corresponding to a LSB position of the Gray code value, and/or one or more inputs corresponding to bit positions of the Gray code value that have significance levels between the MSB and the LSB. The inputs 103 may receive input logic levels and/or voltages corresponding to a Gray code value that the sequential logic element 102 stores in response to an update operation.

The update operation may be initiated by a trigger detected by the sequential logic element 102. The trigger may include a trigger internal to the sequential logic element 102, such as through a clock internal to the sequential logic element wherein a rising edge, a falling edge, and/or a change in state of the clock that is utilized as the trigger. In response to detecting the rising edge, the falling edge, and/or the change in the state of the clock, the sequential logic element 102 may replace the current Gray code value with an updated Gray code value that resides on the inputs 103 at the time of the trigger. The sequential logic element 102 may store the updated Gray code value until another trigger is detected and may maintain the outputs 101 at output logic levels and/or voltages corresponding to the updated Gray code value until another trigger is detected.

In some embodiments, the trigger may be provided to the sequential logic element 102 by an optional external source, such as by optional clock circuitry 130. The optional clock circuitry 130 may provide the sequential logic element 102 with a clock signal and the sequential logic element 102 may be triggered by the clock signal, such as by a rising edge, a falling edge, and/or a change of the state of the clock signal.

In some further embodiments, the trigger for the update operation may include detection, by the sequential logic element 102, of a change in one or more input logic levels and/or voltages of the inputs 103. In response to detection of the change of the one or more input logic levels and/or voltages, the sequential logic element 102 may store the updated Gray code value that resides on the inputs 103. In some embodiments, the sequential logic element 102 may include a delay period, for which the sequential logic element 102 determines if the change in the one or more input logic levels and/or voltages remains in the changed state for the delay period prior to storing the updated Gray code value.

The bidirectional Gray code counter 100 may include logic circuitry 104 coupled to the sequential logic element 102. The logic circuitry 104 may receive the current Gray code value from the outputs 101 of the sequential logic element 102 and provide the updated Gray code value to the inputs 103 of the sequential logic element 102 to be stored by the sequential logic element 102 in response to an update operation. The logic circuitry 104 may update, through performance of an increment or a decrement of the current Gray code value, the current Gray code value to be the updated Gray code value. The performance of the increment or the decrement of the current Gray code value to the updated Gray code value may maintain the current Gray code value and/or the updated Gray code value in Gray code format throughout the performance.

The updated Gray code value provided by the logic circuitry 104 may be a sequential Gray code value to the current Gray code value stored in the sequential logic element 102. The sequential Gray code value may be an incremented Gray code value produced by performance an increment operation on the current Gray code value or may be a decremented Gray code value produced by performance of a decrement operation on the current Gray code value.

In various embodiments, the logic circuitry 104 may perform the increment operation as part of the update of the Gray code value. To perform the increment operation, the logic circuitry 104 may update the LSB stored in the LSB position of the sequential logic element 102. The logic circuitry 104 may perform a logical exclusive-or operation on bits within the current Gray code value that have a greater significance than the LSB. The logic circuitry 104 may set the updated LSB to be equal to a logical inverse of the resultant value produced by the logical exclusive-or operation.

In various embodiments, the logic circuitry 104 may update, in the increment operation, a bit located adjacent to the LSB (also referred to as bit position $g_1$) within the current Gray code value. The logic circuitry 104 may determine whether the LSB of the current Gray code value is a logical one or a logical zero. Based on a determination that the LSB is a logical zero, the logic circuitry 104 may maintain a value of the bit located adjacent to the LSB. Based on a determination that the LSB is a logical one, the logic circuitry 104 may update the bit located adjacent to the LSB. The logic circuitry 104 may perform a logical exclusive-or operation on bits within the Gray code value that have a greater significance than the bit adjacent to the LSB. The logic circuitry 104 may set the updated bit adjacent to the LSB to be equal to the logical inverse of a resultant value produced by the performance of the logical exclusive-or operation.

In various embodiments, the logic circuitry 104 may update, in the increment operation, upper bits, including the MSB, other than the LSB and the bit located adjacent to the LSB (also referred to as bit positions $g_2$ through $g_{N-1}$). The logic circuitry 104 may determine if a bit within the upper bits is adjacent to a less significant bit that is the least significant logical one of the current Gray code value. The logic circuitry 104 may maintain a value of the bit based on a determination that the adjacent, less significant bit is not the least significant logical one of the current Gray code value. Based on a determination that the adjacent, less significant bit is the least significant logical one of the current Gray code value, the logic circuitry 104 may perform a logical exclusive-or operation on bits within the Gray code value that have greater significance than the bit. The logic circuitry 104 may set the updated bit to be equal to the logical inverse of the resultant value of the logical exclusive-or operation.

In various embodiments, the logic circuitry 104 may perform the updates of the LSB, the adjacent bit to the LSB, and/or the upper bits concurrently. In some embodiments, the logic circuitry may delay one or more of the updates of the LSB, the adjacent bit to the LSB, and/or the upper bits such that the updates may occur at different times. Further, the update operation performed on the current Gray code value may include one or more of the updates of the LSB, the adjacent bit to the LSB, and/or the upper bits as part of the increment operation applied to the current Gray code value to produce the updated Gray code value.

In various embodiments, the logic circuitry 104 may perform the decrement operation as part of the update of the Gray code value. To perform the decrement operation, the logic circuitry 104 may update the LSB stored in the LSB position of the sequential logic element 102. The logic circuitry 104 may perform a logical exclusive-or operation on bits within the Gray code value that have greater significance than the LSB (also referred to as $g_1$ through $g_{N-1}$). The logic circuitry 104 may set the updated LSB to be equal to a resultant value produced by the performance of the logical exclusive-or operation.

In various embodiments, the logic circuitry 104 may update, in the decrement operation, a bit adjacent to the LSB. The logic circuitry 104 may determine whether the LSB of the current Gray code is a logical one or a logical zero. The logic circuitry 104 may maintain a value of the bit adjacent to the LSB based on a determination that the LSB is a logical zero. The logic circuitry 104 may perform a logical exclusive-or operation on bits within the Gray code value that have greater significance than the bit adjacent to the LSB based on a determination that the LSB is a logical one. The logic circuitry 104 may set the updated LSB to the resultant value produced by the performance of the logical exclusive-or operation.

In various embodiments, the logic circuitry 104 may update, in the decrement operation, upper bits, including the MSB, of the Gray code value that are not the LSB or the bit adjacent to the LSB. The logic circuitry 104 may determine, for a bit of the upper bits, whether an adjacent bit that has less significance than the bit is a least significant logical one of the current Gray code value. The logic circuitry 104 may maintain a value of the bit based on a determination that the adjacent, less significant bit is not the least significant logical one. The logic circuitry 104 may perform a logical exclusive-or operation on bits within the current Gray code that have a greater significance than the bit based on a determination that the adjacent, less significant bit is the least significant logical one of the Gray code value. The logic circuitry 104 may set the updated bit equal to be a resultant value produced by the performance of the logical exclusive-or operation.

In various embodiments, the logic circuitry 104 may include electrical elements, including multiplexers, logical or gates, logical nor gates, logical and gates, logical nand gates, and/or logical inverters, to perform the updates of current Gray code value described above. The electrical elements utilized by the logic circuitry 104 for performance of the increment of the current Gray code value may be the same electrical elements utilized by the logic circuitry 104 for performance of the decrement of the current Gray code value. In some embodiments, the logic circuitry 104 includes a plurality of logic gates, wherein the same logic gates are utilized for performance of the increment of the Gray code value and for performance of the decrement of the Gray code value.

In various embodiments, the logic circuitry 104 may determine whether to provide the incremented Gray code value or the decremented Gray code value as the sequential Gray code value based on a bidirectional indicator signal received by the logic circuitry 104 on an increment line 128. The logic circuitry 104 may provide the incremented Gray code value in response to a determination that the bidirectional indicator signal is in a first state (either a high or low state) and may provide the decremented Gray code value in response to a determination that the bidirectional indicator signal is in a second state (a different state than the first state). The logic circuitry 104 may replace the current Gray code value stored in the sequential logic element 102 with the incremented Gray code value or the decremented Gray code value.

In various embodiments, the logic circuitry 104 may identify potential wraparound conditions of the Gray code value and prevent update of the Gray code value in response to the identification of the wraparound conditions. The logic circuitry 104 may determine that the Gray code value stored in the sequential logic element is equal to a maximum Gray code value or a minimum Gray code value that can be represented by the bidirectional Gray code counter 100 and prevent the update of the Gray code value in response to the determination. The prevention of the update of the Gray code value may be implemented by maintaining the updated Gray code value to be equal to the current Gray code value, in contrast to setting the updated Gray code value to the sequential Gray code value as described above.

In various embodiments, the logic circuitry 104 may include one or more multiplexers, such as multiplexers 106. A number of the multiplexers 106 may correspond to the number of bits in the Gray code value and the number of inputs 103 to the sequential logic element 102. The number of the multiplexers 106 may have a one to one ratio with the number of bits in the Gray code value and/or the number of inputs 103 to the sequential logic element 102. Each of the multiplexers 106 may correspond to a single bit position of the Gray code value, including a multiplexer corresponding to the MSB position of the Gray code value, a multiplexer corresponding to the LSB position of the Gray code value, and/or one or more multiplexers corresponding to bit positions between the MSB position and the LSB position.

In various embodiments, each of the multiplexers 106 may have an output that is coupled to an input of the sequential logic element 102, wherein the output of the multiplexer 106 and the input of the sequential logic element 102 may correspond to a same bit position of the Gray code value. The output of each of multiplexers 106 may provide a logic level and/or voltage to the corresponding input of the sequential logic element 102, the logic level and/or voltage associated with a logic level and/or voltage of the corresponding bit position of the Gray code value to the output.

In various embodiments, each of the multiplexers 106 may include two inputs. One of the two inputs may be coupled to an output of the sequential logic element 102, the output of the sequential logic element 102 corresponding to a same bit position of the Gray code value as the bit position to which the multiplexer corresponds. In some embodiments, the multiplexers 106 may include more than two inputs and one or more of the more than two inputs may be coupled to the output.

In various embodiments, each of the multiplexers 106 may further include a select input. The select input may receive a signal that indicates which of the inputs of the corresponding multiplexer should be present at the output of the multiplexer. Each of the multiplexers 106 may maintain a logic level and/or voltage on the corresponding output of the multiplexer equal to one of the inputs of the multiplexer based on the signal received on the select input.

While the description refers to the multiplexers 106 as being multiple multiplexers with each multiplexer corresponding to an input of the sequential logic element 102, it is to be understood that the logic circuitry 104 may include a single multiplexer with multiple inputs, multiple outputs, and/or multiple select inputs with each of the multiple inputs, multiple outputs, and/or multiple select inputs corresponding to an input of the sequential logic element 102.

The logic circuitry 104 may include one or more logical exclusive-or gates, including logical exclusive-or gates 110 and logical exclusive-or gates 112. The logical exclusive-or gates 110 may each be associated with a corresponding bit position of the Gray code value. The logical exclusive-or gates 110 may correspond to the bit positions from the LSB position of the Gray code value to the $g_{N-3}$ bit position. A logical exclusive-or gate of the logical exclusive-or gates 110 may receive a value of an adjacent bit with greater significance than the bit position corresponding the logical exclusive-or gate and a value/s of the bits of greater significance of the adjacent bit and/or a resultant value of an exclusive-or operation applied to the bits of greater significance of the adjacent bit. The logical exclusive-or gate may output a resultant value of an exclusive-or operation applied to the received values.

The logical exclusive-or gates 112 may each be associated with a corresponding bit position of the Gray code value. The logical exclusive-or gates 112 may correspond to bit positions from the LSB position to the $g_{N-2}$ bit position. A logical exclusive-or gate of the logical exclusive-or gates 112 may receive the increment line 128, that carries the bidirectional indicator signal, and a value of bits with greater significance than the bit position corresponding to the logical exclusive-or gate and/or a resultant value of a logical exclusive-or operation applied to the bits with greater significance. The logical exclusive-or gate may output a resultant value of an exclusive-or operation applied to the received values. The logical exclusive-or gate may output the resultant value to a corresponding one of the inputs of the multiplexers 106.

The logic circuitry 104 may include a logical exclusive-nor gate 114. The logical exclusive-nor gate 114 may correspond to the MSB position of the Gray code value. The logical exclusive-nor gate 114 may receive a value of an adjacent bit with lesser significance to the MSB position and the increment line 128, that carries the bidirectional indicator signal. The logical exclusive-nor gate 114 may output a resultant value of a logical exclusive-nor operation applied to the received values. The logical exclusive-nor gate 114 may output the resultant value to a corresponding one input of a multiplexer, of the multiplexers 106, corresponding to the MSB position.

The logic circuitry 104 may include one or more logical and gates, such as logical and gate 116, logical and gate 118, logical and gates 120, logical and gate 122, and logical and gates 124. The logical and gate 116 may correspond to the $g_1$ bit position. The logical and gate 116 may receive an update line 126, that carries an update signal, and a value of the LSB. The logical and gate 116 may output a resultant value of a logical and operation applied to the received values. The logical and gate 116 may output the resultant value to a select line of the multiplexer 106 that corresponds to the $g_1$ bit position. The multiplexer 106 may utilize the resultant value provided on the select line to determine which of the inputs to the multiplexer is to be output by the multiplexer.

The logical and gate 118 may correspond to a $g_2$ bit position. The logical and gate 118 may receive an update signal on an update line 126, a value of the $g_1$ bit, and a logical inverse of the value of the MSB. The logical and gate 118 may output a resultant value of a logical and operation applied to the received values. The logical and gate 118 may output the resultant value to a select line of the multiplexer 106 corresponding to the $g_2$ bit position. The multiplexer may utilize the resultant value provided on the select line to determine which of the inputs to the multiplexer is to be output by the multiplexer.

The logical and gates 120 may correspond to bit positions between the MSB position and the $g_2$ bit position. The individual logical and gates 120 may receive the update signal on update line 126, a value of the adjacent bit with lesser significance than the bit position corresponding to the logical and gate, and a resultant value of a logical nand operation applied to bits of the current Gray code value with lesser significance than the adjacent bit. The logical and gate may output a resultant value of a logical and operation applied to the received values. The logical and gate may output the resultant value to a select line of the multiplexer 106 that corresponds to a same bit position as the logical and gate. The multiplexer may utilize the resultant value provided on the select line to determine which of the inputs to the multiplexer is to be output by the multiplexer.

The logical and gate 122 may correspond to the MSB position. The logical and gate 122 may receive the update signal on the update line 126 and a resultant value of a logical nand operation applied to bits of the current Gray code value with lesser significance than an adjacent bit, the adjacent bit with lesser significance than the MSB. The logical and gate 122 may output a resultant value of a logical and operation applied to the received values. The logical and gate 122 may output the resultant value to a select line of the multiplexer 106 corresponding to the MSB position. The multiplexer may utilize the resultant value provided on the select line to determine which of the inputs to the multiplexer is to be output by the multiplexer.

The logical and gates 124 may correspond to the MSB position ($g_{N-1}$) and the $g_{N-2}$ bit position, respectively, as shown in FIG. 1. The individual logical and gates 124 may receive a resultant value of a logical inverse operation applied to an adjacent bit with less significance than a bit corresponding to the respective logical and gate 124 and a resultant value of a logical nand operation applied to bits with lesser significance than the adjacent bit. The logical and gate 124 may output a resultant value of a logical and operation applied to the received bits. The logical and gate 124 may output the resultant value to one or more of the logical and gates 120 and/or the logical and gate 122.

In various embodiments, the logic circuitry 104 may further include a logical nand gate 125. The logical nand gate 125 may correspond to the $g_3$ bit position. The logical nand gate 125 may receive a value of the $g_1$ bit and a value of the LSB ($g_0$). The logical nand gate 125 may output a resultant value of a logical nand operation applied to the received bits. The logical nand gate 125 may output the resultant value to one or more of the logical and gates 120 and/or logical and gates 124.

While the bidirectional Gray code counter 100 is illustrated and described for a six-bit Gray code value, it is to be understood that the bidirectional Gray code counter 100 may be extended or contracted to accommodate greater or fewer bits than illustrated and described. To accommodate the greater or fewer bits, the logic circuitry 104 may include more or less electrical elements that have a configuration similar to the configuration of the electrical elements (including the multiplexer, logical and gates, and logical exclusive-or gates) corresponding to the $g_{N-3}$ bit position as illustrated and described.

Figure 2:
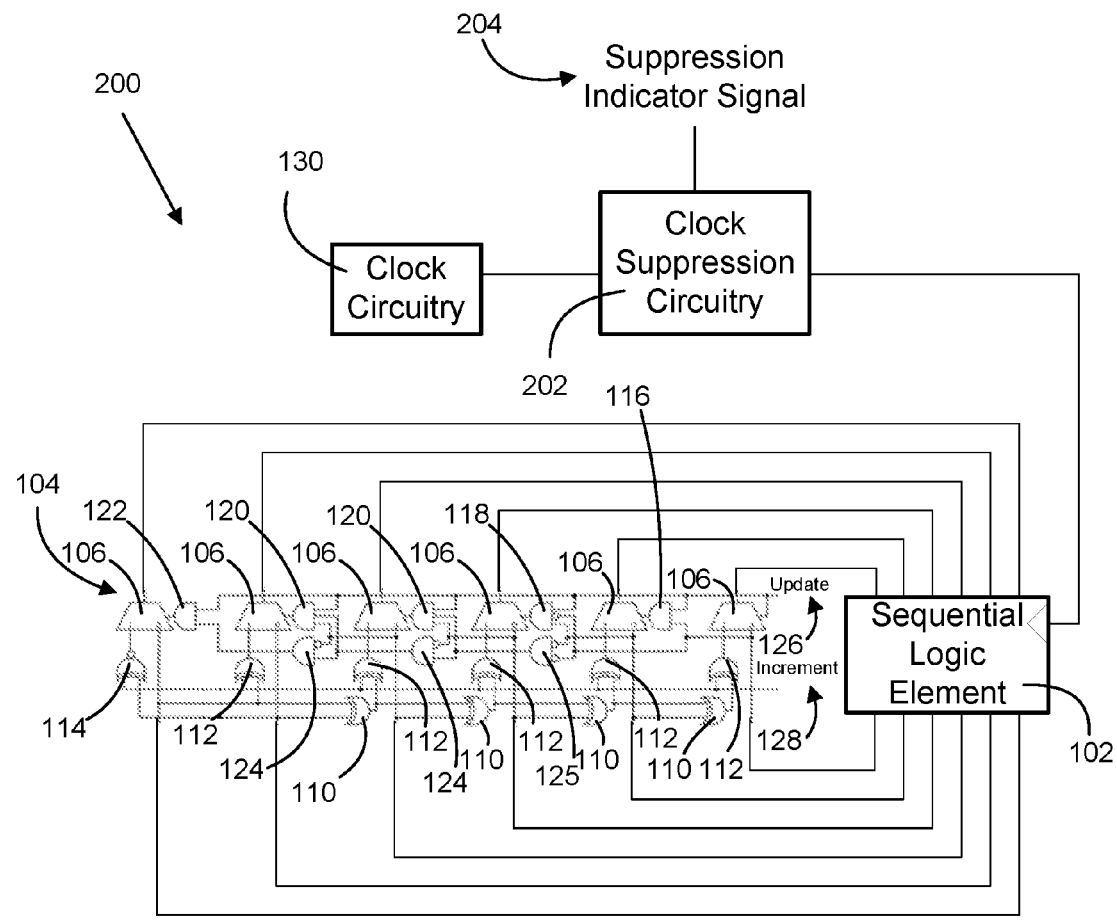
FIG. 2 illustrates an example bidirectional Gray code counter with clock suppression circuitry, according to various embodiments.

FIG. 2 illustrates an example bidirectional Gray code counter 200 with clock suppression circuitry 202, according to various embodiments. In some embodiments, the Gray code counter 200 may count in binary reflected Gray code. The bidirectional Gray code counter 200 may include the sequential logic element 102, the logic circuitry 104 and the clock circuitry 130 as described in relation to the description of FIG. 1. The sequential logic element 102, the logic circuitry 104 and the clock circuitry 130 may include one or more of the corresponding features described in relation to the description of FIG. 1.

The bidirectional Gray code counter 200 may include the clock suppression circuitry 202. The clock suppression circuitry 202 may be coupled between the clock circuitry 130 and the sequential logic element 102. The sequential logic element 102 may be triggered to update a stored Gray code value in the sequential logic element 102 in response to a feature of a clock signal produced by the clock circuitry 130, such as by a rising edge, a falling edge, and/or a change of the state of the clock signal. The clock suppression circuitry 202 may suppress the clock signal and/or maintain a current value of the clock signal, such that the sequential logic element 102 does not receive or detect the feature to trigger the update of the sequential logic element 102.

The clock suppression circuitry 202 may receive a suppression indicator signal 204 that indicates whether the clock suppression circuitry 202 is to suppress the clock signal and/or maintain a current value of the clock signal. The clock suppression circuitry 202 may determine a state of the suppression indicator signal 204. In response to determination that the suppression indicator signal 204 is in a first state, the clock suppression circuitry 202 may allow the clock signal to pass from the clock circuitry 130 to the sequential logic element 102 without interruption. In response to determination that the suppression indicator signal 204 is in a second state, different than the first state, the clock suppression circuitry 202 may suppress the clock signal (e.g., prevent the clock signal from passing to the sequential logic element 102 and/or maintain the current value of the clock signal).

When the clock suppression circuitry 202 suppresses the clock signal, the sequential logic element 102 will not be triggered to update the current Gray code value stored by the sequential logic element 102. Effectively, through suppression of the clock signal, the clock suppression circuitry 202 prevents the bidirectional Gray code counter 200 from counting.

Figure 3:
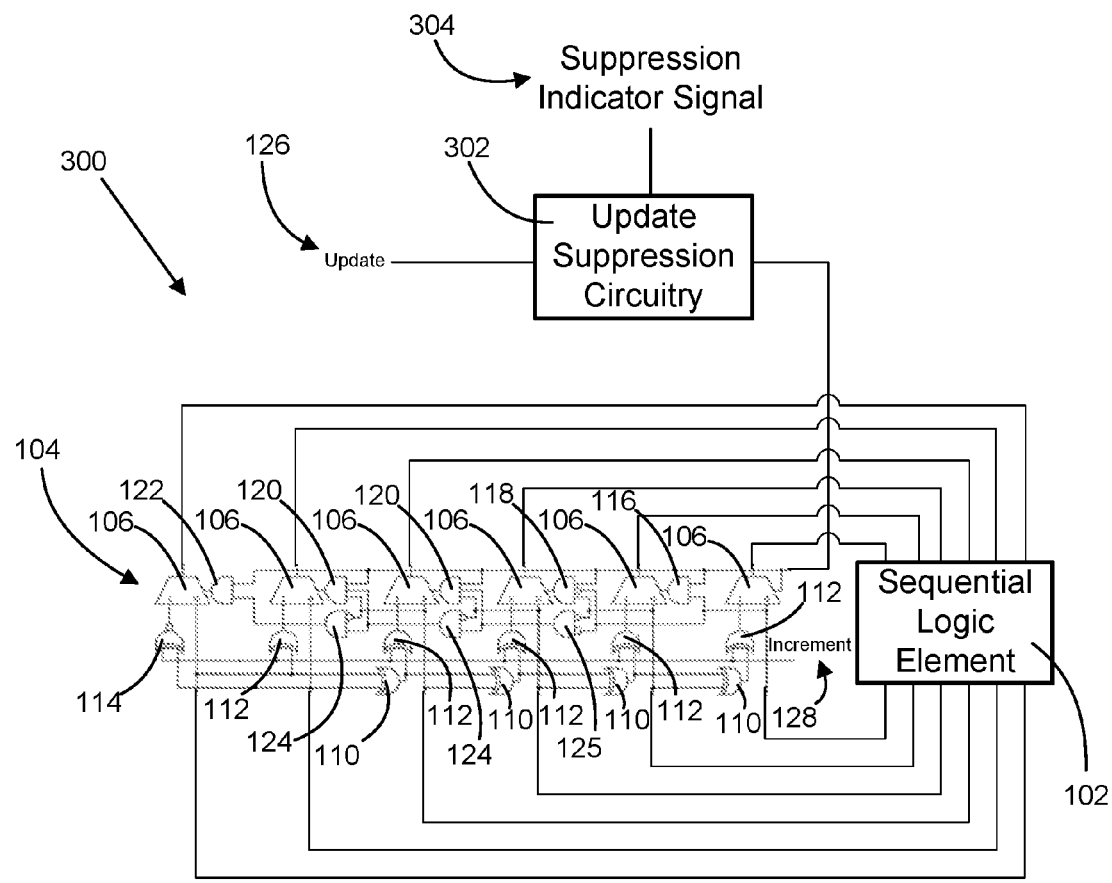
FIG. 3 illustrates an example bidirectional Gray code counter with update suppression circuitry, according to various embodiments.

FIG. 3 illustrates an example bidirectional Gray code counter 300 with update suppression circuitry 302, according to various embodiments. In some embodiments, the Gray code counter 300 may count in binary reflected Gray code. The bidirectional Gray code counter 200 may include the sequential logic element 102, the logic circuitry 104 and the clock circuitry 130 as described in relation to the description of FIG. 1. The sequential logic element 102, the logic circuitry 104 and the clock circuitry 130 may include one or more of the corresponding features described in relation to the description of FIG. 1.

The bidirectional Gray code counter 300 may include the update suppression circuitry 302 coupled between an input of the update line 126, that carries the update signal, and the logic circuitry 104. The update signal may be provided, either directly or indirectly through logic elements, to the respective select lines of the multiplexers 106 of the logic circuitry 104. The individual multiplexer 106 may determine a state of the update signal and select which of the inputs to the multiplexer 106 to provide to the output of the multiplexer 106 based on the state (e.g., logic value) of the update signal. In a first state of the update signal, the multiplexers 106 may provide to the outputs values corresponding to the current Gray code value stored in the sequential logic element 102. Accordingly, the multiplexers 106 may maintain the updated Gray code value as equal to the current Gray code value based on the detection of the one state of the update signal, effectively preventing increment or decrement of the current Gray code value. In a second state of the update signal, the multiplexers 106 may provide to the outputs values corresponding to an incremented or decremented Gray code value.

The update suppression circuitry 302 may receive a suppression indicator signal 304 and may determine a state of the suppression indicator signal 304. Based on a determination that the suppression indicator signal 304 is in a first state, the update suppression circuitry 302 may allow the update signal to pass unaffected to the logic circuitry 104. Based on a determination that the suppression indicator signal 304 is in a second state, different than the first state, the update suppression circuitry 302 may suppress the update signal. While suppressing the update signal, the update suppression circuitry 302 may maintain the update signal on the update line 126 provided to the logic circuitry 104 in the first state that causes the multiplexers 106 to maintain the updated Gray code value as equal to the current Gray code value. Effectively, the update suppression circuitry 302 prevents the bidirectional Gray code counter 300 from performance of an increment and/or decrement operation.

One or more of the features of the bidirectional Gray code counter 300 may be utilized in combination with one or more of the features of the bidirectional Gray code counter 200 described in relation to FIG. 2. For example, in some embodiments of the bidirectional Gray code counter 300, the bidirectional Gray code counter 300 may include the update suppression circuitry 302, the clock circuitry 130, and/or the clock suppression circuitry 202. Further, in these embodiments, the bidirectional Gray code counter 300 may include one or more of the features associated with the update suppression circuitry 302, the clock circuitry 130, and/or the clock suppression circuitry 202.

Figure 4:
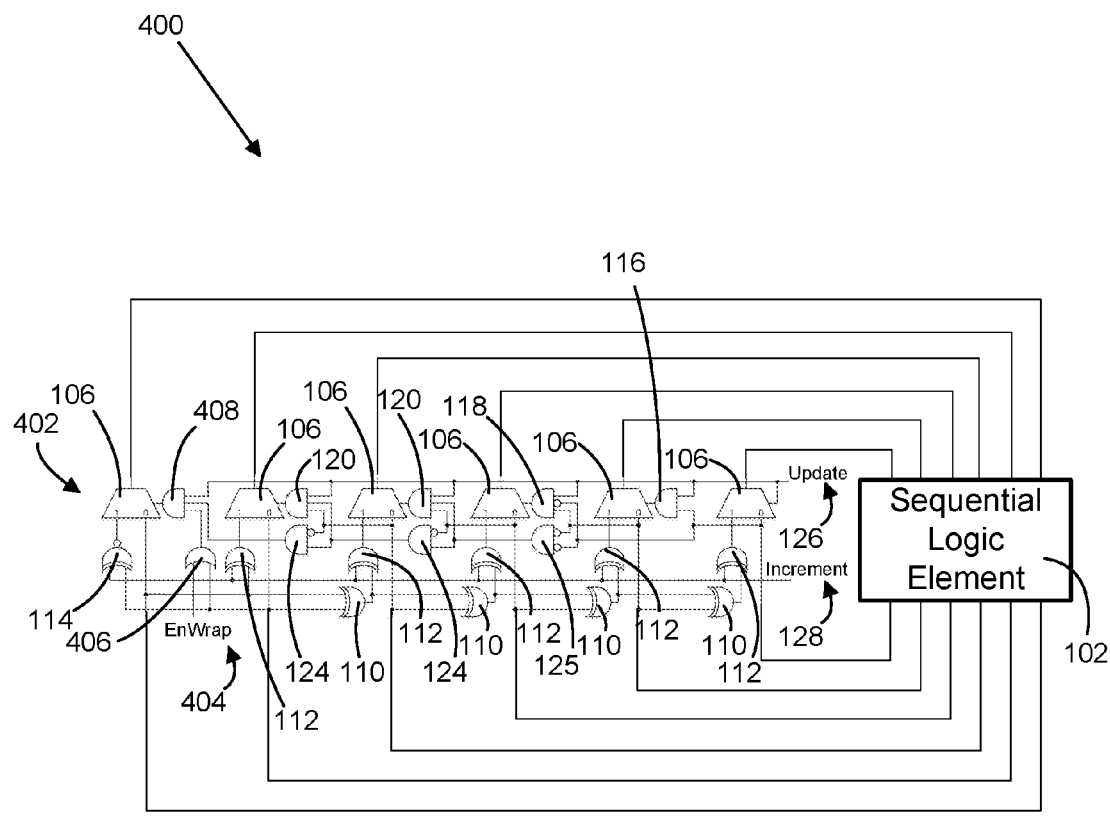
FIG. 4 illustrates an example bidirectional Gray code counter with wrap enablement.

FIG. 4 illustrates an example bidirectional Gray code counter 400 with wrap enablement. In some embodiments, the Gray code counter 400 may count in binary reflected Gray code. The bidirectional Gray code counter 400 may include the sequential logic element 102, as described in relation to FIG. 1, to store a Gray code value.

The bidirectional Gray code counter 400 may include logic circuitry 402. The logic circuitry 402 may perform one or more of the same operations (including the update operation of the current Gray code value) of the logic circuitry 104, described in relation to FIG. 1. The logic circuitry 402 may include one or more of the electrical elements and/or logic elements of the logic circuitry 104, including the multiplexers 106, the logical exclusive-or gates 110, the logical exclusive-or gates 112, the logical exclusive-nor gate 114, the logical and gate 116, the logical and gate 118, the logical and gates 120, the logical and gates 124, the logical nand gate 125, or some combination thereof.

The logic circuitry 402 may receive an enable wrap signal on an EnWrap line 404. The logic circuitry 402 may determine a state of the enable wrap signal and may enable wraparound of the Gray code value by the bidirectional Gray code counter 400. With the wraparound enabled, the logic circuitry 402 may increment a current Gray code value corresponding to a maximum value representable by the bidirectional Gray code counter 400 to a minimum value representable by the bidirectional Gray code counter 400 and/or may decrement a current Gray code value corresponding to the minimum value to the maximum value. In some embodiments, the sequential logic element 102 may include a reserved bit for indication that a wraparound has occurred. In some embodiments, the bidirectional Gray code counter 400 may include a separate sequential element and/or memory device for storage of an indication that a wraparound has occurred, and/or a count of an amount of times that the wraparound has occurred and/or a direction corresponding to each of the wraparounds that occurred.

The logic circuitry 402 may include a logical or gate 406. The logical or gate 406 may correspond to a MSB position of the Gray code value stored in the sequential logic element 102. The logical or gate 406 may receive the enable wrap signal and a value of the $g_{N-2}$ bit position of the current Gray code value stored in the sequential logic element 102. The logical or gate 406 may output a resultant value produced by a logical or operation applied to the received values.

The logic circuitry 402 may include a logical and gate 408. The logical and gate 408 may be used instead of logical and gate 122 of the logic circuitry 104, described in relation to FIG. 1. The logical and gate 408 may correspond to the MSB position of the Gray code value. The logical and gate 408 may receive the update signal on the update line 126, a resultant value of a logical nand operation applied to bits with lesser significance than the $g_{N-2}$ bit position and the resultant value output by the logical or gate 406. The logical and gate 408 may output a resultant value produced by a logical and operation applied to the received values. The logical and gate 408 may output the resultant value to the select line of the multiplexer 106 corresponding to the MSB position. The multiplexer may utilize the resultant value provided to the select line to select which of the values on the inputs of the multiplexer should be output from the multiplexer.

One or more of the features of the bidirectional Gray code counter 400 may be utilized in combination with one or more of the features of the bidirectional Gray code counter 200, described in relation to FIG. 2, and/or of the bidirectional Gray code counter 300, described in relation to FIG. 3. For example, in some embodiments of the bidirectional Gray code counter 400, the bidirectional Gray code counter 400 may include one or more of the elements selected from the group of elements including the update suppression circuitry 302, and the clock circuitry 130, the clock suppression circuitry 202, and/or the elements associated with the wrap enable. Further, in these embodiments, the bidirectional Gray code counter 400 may include one or more of the features associated with the update suppression circuitry 302, the clock circuitry 130, the clock suppression circuitry 202, and/or the wrap enable function.

Figure 5:
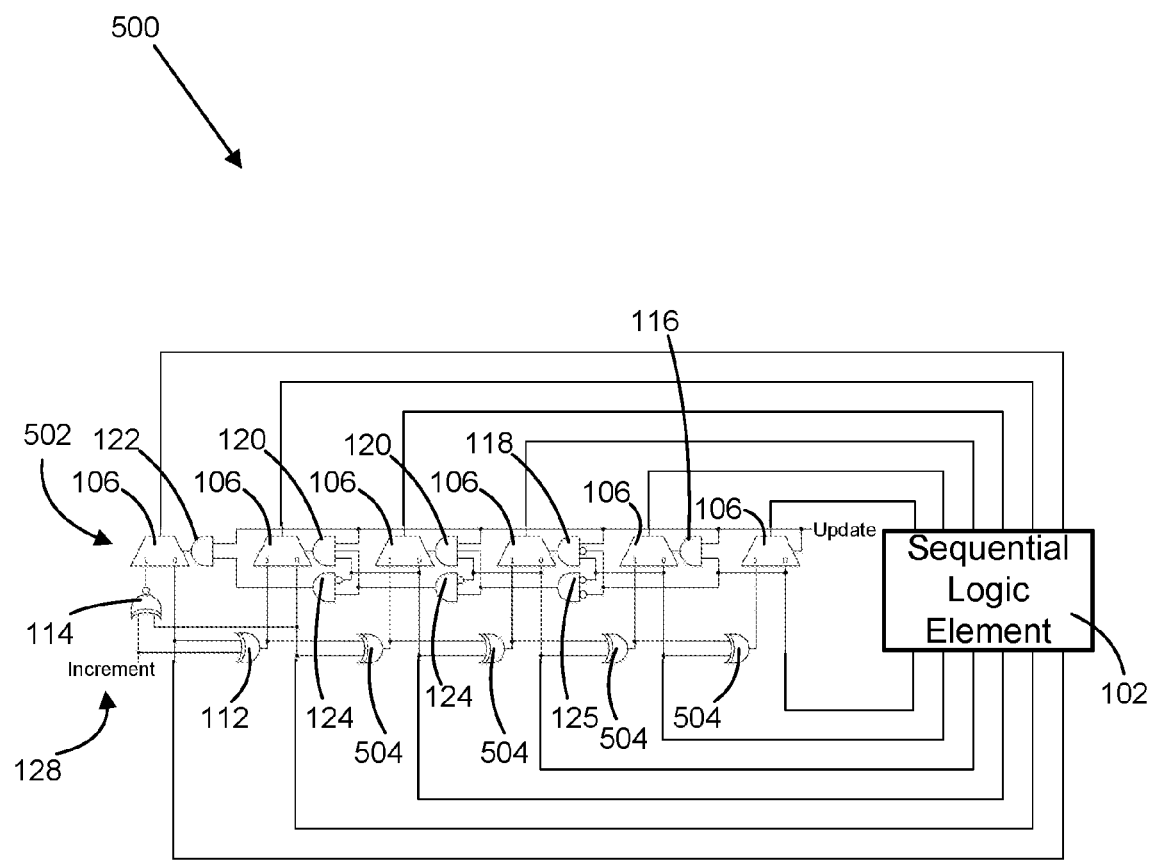
FIG. 5 illustrates an example bidirectional Gray code counter with a stepped bidirectional indicator signal.

FIG. 5 illustrates an example bidirectional Gray code counter 500 with stepped bidirectional indicator signal. The bidirectional Gray code counter 500 may include the sequential logic element 102, as described in relation to FIG. 1, to store a Gray code value.

The bidirectional Gray code counter 500 may include logic circuitry 502. In some embodiments, the Gray code counter 500 may count in binary reflected Gray code. The logic circuitry 502 may perform one or more of the same operations (including the update operation of the current Gray code value) of the logic circuitry 104, described in relation to FIG. 1. The logic circuitry 502 may include one or more of the electrical elements and/or logic elements of the logic circuitry 104, including the multiplexers 106, the logical exclusive-or gates 112, the logical exclusive-nor gate 114, the logical and gate 116, the logical and gate 118, the logical and gates 120, the logical and gates 124, the logical nand gate 125, or some combination thereof.

The logic circuitry 502 may include a logical exclusive-or gate 112 corresponding to the $g_{N-2}$ bit position. The logical exclusive-or gate 112 may receive the MSB of the Gray code value and a bidirectional indicator signal, transmitted on the increment line 128. The logical exclusive-or gate 112 may output a resultant value produced by performance of a logical exclusive-or operation on the received values. The logical exclusive-or gate 112 may output the resultant value to an input of the multiplexer that corresponds to the $g_{N-2}$ bit position.

The logic circuitry 502 may include one or more logical exclusive-or gates 504. Each of the logical exclusive-or gates 504 may correspond to a bit position of the Gray code value stored in the sequential logic element 102. The logical exclusive-or gates 504 may correspond to bit positions from the LSB position to the $g_{N-3}$ bit position. Each of the logical exclusive-or gates 504 may receive a value of the bit in the corresponding bit position to the logical exclusive-or gate. Each of the logical exclusive-or gates 504 may further receive a resultant value produced by the exclusive-or gate 112 or another of the logical exclusive-or gates corresponding to an adjacent bit position with greater significance than the corresponding bit position. Each of the logical exclusive-or gates 504 may output a resultant value produced by performance of a logical exclusive-or operation on the received values. Each of the logical exclusive-or gates 504 may output the resultant value to an input of the multiplexer corresponding to the same bit position.

The logic circuitry 502 may effectively step the bidirectional indicator signal through the logical exclusive-or gate 112 and/or the logical exclusive-or gates 504. The logic circuitry 502 may be utilized in applications where transmission time of the bidirectional indicator signal is not critical. In some embodiments, the logic circuitry may utilize less logic gates than the other logic circuitry described above and, therefore consume less power.

One or more of the features of the bidirectional Gray code counter 500 may be utilized in combination with one or more of the features of the bidirectional Gray code counter 200, described in relation to FIG. 2, of the bidirectional Gray code counter 300, described in relation to FIG. 3, and/or of the bidirectional Gray code counter 400, described in relation to FIG. 4. For example, in some embodiments of the bidirectional Gray code counter 500, the bidirectional Gray code counter 500 may include one or more of the elements selected from the group of elements including the update suppression circuitry 302, and the clock circuitry 130, the clock suppression circuitry 202, the elements associated with the wrap enable, and/or the elements associated with the stepped bidirectional indicator signal. Further, in these embodiments, the bidirectional Gray code counter 500 may include one or more of the features associated with the update suppression circuitry 302, the clock circuitry 130, the clock suppression circuitry 202, the wrap enable function, and/or the stepped bidirectional indicator signal.

The embodiments described throughout this disclosure may be derived through use of non-trivial algebra. Performance of an increment from one Gray code value to the subsequent Gray code value may be performed by transforming the Gray code value into binary and using the binary equivalent for increment to the subsequent Gray code value.

The incremented binary bits may be determined by the equation $c_i = P_i \otimes \Pi_{i-1}$, where $c_i$ is the incremented bit, $P_i$ is produced through performance of an exclusive or operation on bits of greater significance than a bit in the pre-incremented value corresponding to $c_i$ and $$\Pi_k = \bigwedge_{j=0}^{k} P_j.$$

The binary-to-Gray code conversion to produce the incremented Gray code value may be produced by $h_i = c_{i+1} \otimes c_i$, wherein $h_i$ is an incremented bit represented in Gray code. Accordingly, $h_i = (P_{i+1} \otimes \Pi_i) \otimes (P_i \otimes \Pi_{i-1})$.

For any $g_j = 1$ (wherein $g_j$ is a bit in the non-incremented Gray word, g, at bit location j) for j<k, $P_k \neq P_j$ and, therefore, $\pi_k = 0$. Therefore, $\Pi_k = (P_{k+1} \otimes g_k) Z_{k-1}$, wherein $$Z_k = \bigwedge_{j=0}^{k} \overline{g_j}.$$

Therefore, $h_i = P_{i+1} \otimes (P_{i+1} \otimes g_i) Z_{i-1} \otimes P_i \otimes (P_i \otimes g_{i-1}) Z_{i-2}$. Utilizing the identity $A \otimes AB = A(\neg B)$ and that $P_k = g_k \otimes P_{k+1}$, $h_i$ can be represented by $h_i = P_{i+1} \overline{Z_{i-1}} \otimes g_i Z_{i-1} \otimes (g_i \otimes P_{i+1}) \overline{Z_{i-2}} \otimes g_{i-1} Z_{i-2}$.

$h_i$ may be separated into two cases based on $Z_{i-2}$, represented by $$h_i = \begin{cases} P_{i+1} \otimes (g_i \otimes P_{i+1}) = g_i, & Z_{i-2} = Z_{i-1} = 0 \\ P_{i+1} \overline{Z_{i-1}} \otimes g_i Z_{i-1} \otimes g_{i-1}, & Z_{i-2} = 1 \end{cases}.$$

Further, $h_i$ may be separated into two subcases based on $g_{i-1}$, remembering that $g_{i-1} = 1 \rightarrow Z_{i-1} = 0$. The two subcases may be represented by $$h_i = \begin{cases} P_{i+1} \otimes (g_i \otimes P_{i+1}) = g_i, & Z_{i-2} = Z_{i-1} = 0 \\ g_i, & Z_{i-2} = 1, g_{i-1} = 0 \\ P_{i+1} \otimes 1 = \overline{P_{i+1}}, & Z_{i-2} = 1, g_{i-1} = 1 \end{cases}.$$

This derived increment operation can be reversed into a decrement operation by flipping the direction of the bit change illustrated above.

Figure 6:
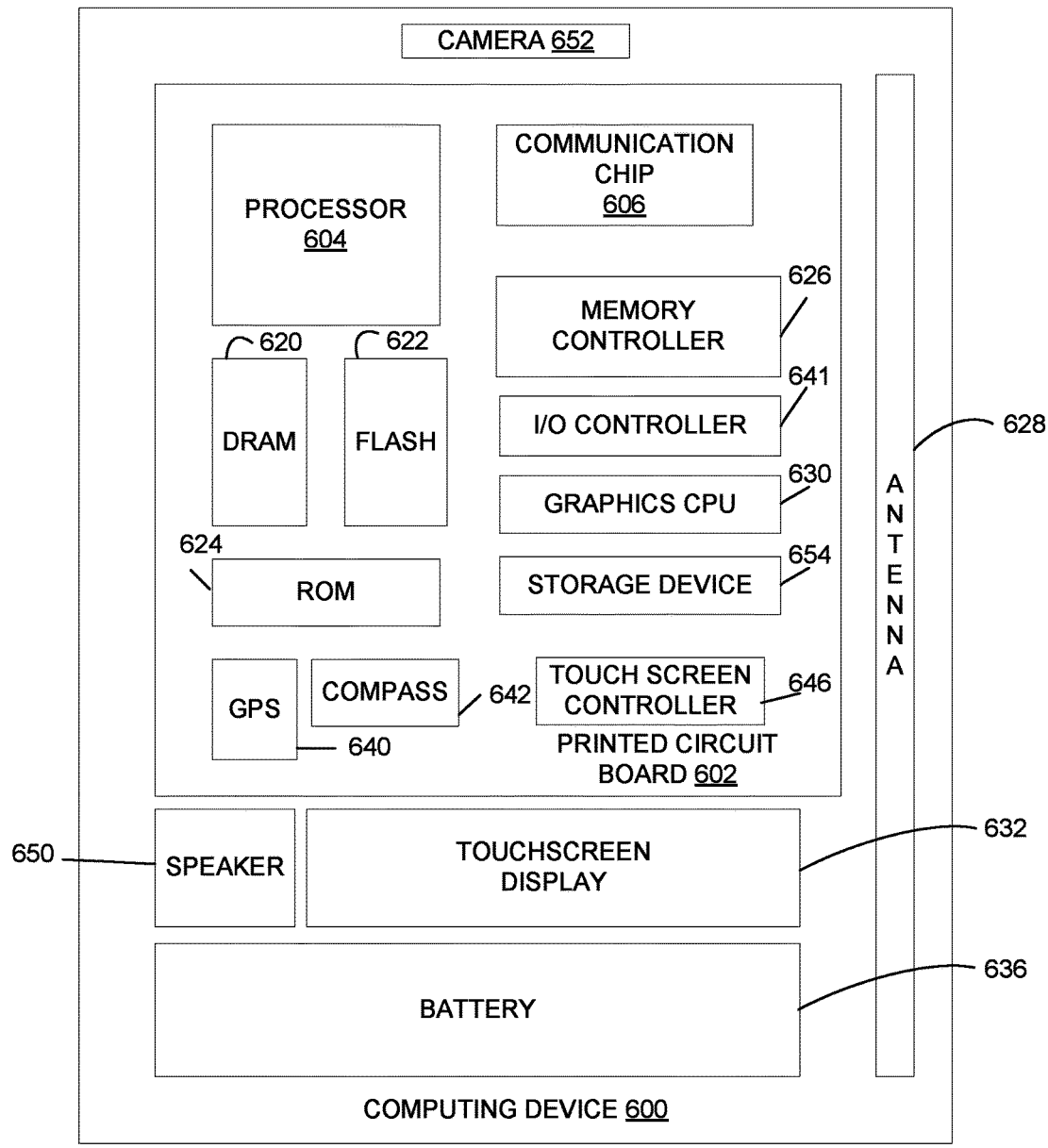
FIG. 6 illustrates an example computing device that may employ the apparatuses and/or methods described herein.

FIG. 6 illustrates an example computing device 600 that may employ the apparatuses and/or methods described herein (e.g., the bidirectional Gray code counter 100, the bidirectional Gray code counter 200, the bidirectional Gray code counter 300, the bidirectional Gray code counter 400 and/or the bidirectional Gray code counter 500), in accordance with various embodiments. As shown, computing device 600 may include a number of components, such as one or more processor(s) 604 (one shown) and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computing device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computing device 600 may include other components that may or may not be physically and electrically coupled to the PCB 602. These other components include, but are not limited to, memory controller 626, volatile memory (e.g., dynamic random access memory (DRAM) 620), non-volatile memory such as read only memory (ROM) 624, flash memory 622, storage device 654 (e.g., a hard-disk drive (HDD)), an I/O controller 641, a digital signal processor (not shown), a crypto processor (not shown), a graphics processor 630, one or more antenna 628, a display (not shown), a touch screen display 632, a touch screen controller 646, a battery 636, an audio codec (not shown), a video codec (not shown), a global positioning system (GPS) device 640, a compass 642, an accelerometer (not shown), a gyroscope (not shown), a speaker 650, a camera 652, and a mass storage device (such as hard disk drive, a solid state drive, compact disk (CD), digital versatile disk (DVD)) (not shown), and so forth.

In some embodiments, the one or more processor(s) 604, flash memory 622, and/or storage device 654 may include associated firmware (not shown) storing programming instructions configured to enable computing device 600, in response to execution of the programming instructions by one or more processor(s) 604, to practice all or selected aspects of the methods described herein. In various embodiments, these aspects may additionally or alternatively be implemented using hardware separate from the one or more processor(s) 604, flash memory 622, or storage device 654.

In various embodiments, one or more components of the computing device 600 may include the bidirectional Gray code counter 100, the bidirectional Gray code counter 200, the bidirectional Gray code counter 300, the bidirectional Gray code counter 400, and/or the bidirectional Gray code counter 500 described herein. For example, the bidirectional Gray code counter 100, the bidirectional Gray code counter 200, the bidirectional Gray code counter 300, the bidirectional Gray code counter 400, and/or the bidirectional Gray code counter 500, and/or the processing circuitry 600 may be included in I/O controller 641, processor 604, memory controller 626, and/or another component of computing device 600.

The communication chips 606 may enable wired and/or wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 602.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 600 may be any other electronic device that processes data.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

Example 1 may include a bidirectional gray code counter, comprising a sequential logic element to store a gray code value and logic circuitry to determine, based on a bidirectional indicator signal, whether to increment or decrement the gray code value, update, through performance of an increment or a decrement of the gray code value based on the determination of whether to increment or decrement the gray code value, the gray code value to be a sequential gray code value and replace the gray code value stored in the sequential logic element with the updated gray code value.

Example 2 may include the bidirectional gray code counter of example 1, wherein, to update the gray code value to be the sequential gray code value, the logic circuitry is to maintain the gray code value in gray code format throughout the update.

Example 3 may include the bidirectional gray code counter of any of the examples 1 and 2, wherein the logic circuitry is to further determine that the gray code value stored in the sequential logic element is equal to a maximum gray code value that can be represented by the bidirectional gray code counter and prevent, based on the determination that the gray code value is equal to the maximum gray code value, the update, through the performance of the increment, of the gray code value.

Example 4 may include the bidirectional gray code counter of any of the examples 1 and 2, wherein the logic circuitry is to further determine that the gray code value stored in the sequential logic element is equal to a minimum gray code value that can be represented by the bidirectional gray code counter and prevent, based on the determination that the gray code value is equal to the minimum gray code value, the update, through the performance of the decrement, of the gray code value.

Example 5 may include the bidirectional gray code counter of any of the examples 1 and 2, wherein, to update, through performance of the increment of the gray code value, the gray code value, the logic circuitry is to update a least significant bit of the gray code value to be a logical inverse of a resultant value produced by performance of a logical exclusive-or operation on bits, within the gray code value, of greater significance than the least significant bit.

Example 6 may include the bidirectional gray code counter of any of the examples 1 and 2, wherein, to update, through performance of the increment of the gray code value, the gray code value, the logic circuitry is to determine whether a least significant bit of the gray code value is a logical one or a logical zero and maintain, based on determination that the least significant bit is a logical zero, a value of a bit adjacent to the least significant bit.

Example 7 may include the bidirectional gray code counter of any of the examples 1 and 2, wherein, to update, through performance of the increment of the gray code value, the gray code value, the logic circuitry is to determine whether a least significant bit of the gray code value is a logical one or a logical zero and update, based on determination that the least significant bit is a logical one, a bit adjacent to the least significant bit to be a logical inverse of a resultant value produced by performance of a logical exclusive-or operation on bits, within the gray code value, of greater significance than the bit adjacent to the least significant bit.

Example 8 may include the bidirectional gray code counter of any of the examples 1 and 2, wherein, to update, through performance of the increment of the gray code value, the gray code value, the logic circuitry is to determine, for an individual bit of the gray code value that is not a least significant bit of the gray-code value and not adjacent to the least significant bit, whether an adjacent, less significant bit is a least significant logical one of the gray code value and if the adjacent, less significant bit is determined not to be the least significant logical one, maintain a value of the individual bit.

Example 9 may include the bidirectional gray code counter of any of the examples 1 and 2, wherein, to update, through performance of the increment of the gray code value, the gray code value, the logic circuitry is to determine, for an individual bit of the gray code value that is not a least significant bit of the gray-code value and not adjacent to the least significant bit, whether an adjacent, less significant bit is a least significant logical one of the gray code value and if the adjacent, less significant bit is determined to be least significant logical one, update the individual bit to be a logical inverse of a resultant value produced by performance of a logical exclusive-or operation on bits, within the gray code value, of greater significance than the individual bit.

Example 10 may include the bidirectional gray code counter of any of the examples 1 and 2, wherein, to update, through performance of the decrement of the gray code value, the gray code value, the logic circuitry is to update a least significant bit of the gray code value to be a resultant value produced by performance of a logical exclusive-or operation on bits, within the gray code value, of greater significance than the least significant bit.

Example 11 may include the bidirectional gray code counter of any of the examples 1 and 2, wherein, to update, through performance of the decrement of the gray code value, the gray code value, the logic circuitry is to determine whether a least significant bit of the gray code value is a logical one or a logical zero and if the least significant bit is determined to be the logical zero, maintain a value of a bit adjacent to the least significant bit.

Example 12 may include the bidirectional gray code counter of any of the examples 1 and 2, wherein, to update, through performance of the decrement of the gray code value, the gray code value, the logic circuitry is to determine whether a least significant bit of the gray code value is a logical one or a logical zero and if the least significant bit is determined to be a logical one, update a bit adjacent to the least significant bit to be a resultant value produced by performance of a logical exclusive-or operation on bits, within the gray code value, of greater significance than the bit adjacent to the least significant bit.

Example 13 may include the bidirectional gray code counter of any of the examples 1 and 2, wherein, to update, through performance of the decrement of the gray code value, the gray code value, the logic circuitry is to determine, for an individual bit of the gray code value that is not a least significant bit of the gray-code value and not adjacent to the least significant bit, whether an adjacent, less significant bit is a least significant logical one of the gray code value and if the adjacent, less significant bit is determined not to be the least significant logical one, maintain a value of the individual bit.

Example 14 may include the bidirectional gray code counter of any of the examples 1 and 2, wherein, to update, through performance of the decrement of the gray code value, the gray code value, the logic circuitry is to determine, for an individual bit of the gray code value that is not a least significant bit of the gray-code value and not adjacent to the least significant bit, whether an adjacent, less significant bit is a least significant logical one of the gray code value and if the adjacent, less significant bit is determined to be the least significant logical one, update the individual bit to be a resultant value produced by performance of logical exclusive-or operation on bits, within the gray code value, of greater significance than the individual bit.

Example 15 may include the bidirectional gray code counter of any of the examples 1 and 2, wherein the logic circuitry includes a plurality of logic gates, wherein the same logic gates are utilized for performance of the increment of the gray code value and for performance of the decrement of the gray code value.

Example 16 may include the bidirectional gray code counter of any of the examples 1 and 2, wherein the logic circuitry includes one or more multiplexers, wherein each multiplexer, of the one or more multiplexers, is associated with a respective bit of the gray code value, and wherein, to update the gray code value, the logic circuitry is to: determine, for each multiplexer whether a respective selection input receives a logical one or a logical zero, for each multiplexer that is determined to receive the logical one at the respective selection input, update a value of the respective bit associated with the respective multiplexer that is determined to receive the logical one and for each multiplexer that is determined to receive the logical zero at the respective selection input, maintain a value of the respective bit associated with the respective multiplexer that is determined to receive the logical zero.

Example 17 may include the bidirectional gray code counter of any of the examples 1 and 2, wherein the logic circuitry is to further detect a wrap enablement signal and enable wraparound of a count of the bidirectional gray code counter in response to detection of the wrap enablement signal.

Example 18 may include an apparatus to bidirectionally count in gray code, comprising means to store of a gray code value means to determine whether to perform an increment or a decrement of the gray code value based on a bidirectional indicator signal, the gray code value to a sequential gray code value and means to perform the increment or the decrement of the gray code value, wherein the means to perform maintains the gray code value in gray code format throughout the performance of the increment or the decrement.

Example 19 may include the apparatus of example 18, further comprising means to update the gray code value in the means for storage with the incremented or the decremented gray code value.

Example 20 may include the apparatus of any of the examples 18 and 19, further comprising means to determine that the stored gray code value is equal to a maximum gray code value representable by the apparatus and means to prevent, based on the determination that the stored gray code value is equal to the maximum gray code value, the performance of the increment of the gray code value.

Example 21 may include the apparatus of any of the examples 18 and 19, further comprising means to determine that the stored gray code value is equal to a minimum gray code value representable by the apparatus and means to prevent, based on the determination that the stored gray code value is equal to the minimum gray code value, the performance of the decrement of the gray code value.

Example 22 may include the apparatus of any of the examples 18 and 19, further comprising means to perform a logical exclusive-or operation on bits, within the gray code value, of greater significance than a least significant bit within the gray code value and means to set the least significant bit of the gray code value to be a logical inverse of a result of the logical exclusive-or operation.

Example 23 may include the apparatus of example any of the examples 18 and 19, further comprising means to determine whether a least significant bit of the gray code value is a logical one or a logical zero and means to maintain, based on determination that the least significant bit is a logical zero, a value of a bit adjacent to the least significant bit.

Example 24 may include the apparatus of example any of the examples 18 and 19, further comprising means to determine whether a least significant bit of the gray code value is a logical one or a logical zero, means to perform a logical exclusive-or operation on bits, within the gray code value, of greater significance than a bit adjacent to the least significant bit and means to set, based on determination that the least significant bit of is the logical one, the bit adjacent to the least significant bit to be a logical inverse of a result of the logical exclusive-or operation.

Example 25 may include the apparatus of any of the examples 18 and 19, further comprising means to determine, for an individual bit of the gray code value that is not a least significant bit of the gray code value and not adjacent to the least significant bit, whether an adjacent, less significant bit is a least significant logical one of the gray code value and means to maintain, based on determination that the adjacent, less significant bit is not the least significant logical one, a value of the individual bit.

Example 26 may include the apparatus of any of the examples 18 and 19, further comprising means to determine, for an individual bit of the gray code value that is not a least significant bit of the gray code value and not adjacent to the least significant bit, whether an adjacent, less significant bit is a least significant logical one of the gray code value, means to perform a logical exclusive-or operation on bits, within the gray code value, of greater significance than the individual bit and means to set, based on determination that the adjacent, less significant bit is the least significant logical one, the individual bit to be a logical inverse of a result of the logical exclusive-or operation.

Example 27 may include the apparatus of any of the examples 18 and 19, further comprising means to perform a logical exclusive-or operation on bits, within the gray code value, of greater significance than a least significant bit of the gray code value and means to set the least significant bit to a result of the logical exclusive-or operation.

Example 28 may include the apparatus of any of the examples 18 and 19, further comprising means to determine that a least significant bit of the gray code value is a logical zero and means to maintain, based on determination that the least significant bit is a logical zero, a value of a bit adjacent to the least significant bit.

Example 29 may include the apparatus of any of the examples 18 and 19, further comprising means to determine that a least significant bit of the gray code value is a logical one, means to perform a logical exclusive-or operation on bits, within the gray code value, of greater significance than a bit adjacent to the least significant bit and means to set, based on determination that the least significant bit is a logical one, the bit adjacent to the least significant bit to be a result of the logical exclusive-or operation.

Example 30 may include the apparatus of any of the examples 18 and 19, further comprising means to determine, for an individual bit of the gray code value that is not a least significant bit of the gray code value and not adjacent to the least significant bit, that an adjacent, less significant bit is not a least significant logical one of the gray code value and means to maintain, based on determination that the adjacent, less significant bit is not the least significant logical one, a value of the individual bit.

Example 31 may include the apparatus of any of the examples 18 and 19, further comprising means to determine, for an individual bit of the gray code value that is not a least significant bit of the gray code value and not adjacent to the least significant bit, that an adjacent, less significant bit is a least significant logical one of the gray code value, means to perform a logical exclusive-or operation on bits, within the gray code value, of greater significance than the individual bit and means to set, based on determination that the adjacent, less significant bit is the least significant logical one, the individual bit to be a result of the logical exclusive-or operation.

Example 32 may include the apparatus of any of the examples 18 and 19, wherein the means to perform includes a plurality of logic gates, wherein the same logic gates are utilized for performance of the increment of the gray code value and for performance of the decrement of the gray code value.

Example 33 may include the apparatus of any of the examples 18 and 19, further comprising means to detect a wrap enablement signal and means to enable wraparound of a count associated with the apparatus in response to detection of the wrap enablement signal.

Example 34 may include a system to bidirectionally count in gray code, comprising a sequential logic element to store a gray code value, one or more multiplexers coupled to the sequential logic, the one or more multiplexers to update or maintain one or more bits of the gray code value based on one or more select signals and logic circuitry coupled to the one or more multiplexers, the logic circuitry to determine a count direction based on a bidirectional indicator signal, provide update values for each of the one or more bits to the one or more multiplexers based on the determined count direction and provide the one or more select values to the one or more multiplexers.

Example 35 may include the system of example 34, further comprising a processor that includes the sequential logic element, the one or more multiplexer, and the logic circuitry, a network interface, and one or more input/output ports of the network interface coupled to the processor.

Example 36 may include the system of example 34, wherein the logic circuitry includes one or more logical exclusive-or gates, each of the one or more logical exclusive-or gates coupled to a respective data input of a respective multiplexer from the one or more multiplexers, wherein each of the one or more logical exclusive-or gates is associated with a respective bit of the gray code value, and wherein the logical exclusive-or gates are to receive the bidirectional indicator signal and a result of a logical exclusive-or operation applied to bits, within the gray code value, of greater significance than the respective bit and output an update value to the respective data input.

Example 37 may include the system of any of the examples 34-36, wherein the logic circuitry includes one or more logical and gates, each of the one or more logical and gates coupled to a respective select input of a respective multiplexer from the one or more multiplexers, wherein each of the one or more logical and gates is associated with a respective bit of the gray code value, and wherein the logical and gates are to receive an update signal, a value of an adjacent, less significant bit of the gray code value to the respective bit and a result of a logical nand operation applied to bits, within the gray code value, of less significance than the adjacent, less significant bit and output a select value to the respective select input that is to cause the respective multiplexer to update or maintain the respective bit based on the select value.

Example 38 may include the system of example 37, further comprising suppression circuitry to suppress the update signal.

Example 39 may include the system of any of the examples 34-36, further comprising clock circuitry to provide a clock signal to the sequential logic element, wherein the sequential logic element is to update the gray code value with an output gray code value of the one or multiplexers based on the clock signal.

Example 40 may include the system of example 39, further comprising suppression circuitry to suppress the clock signal.

What is claimed is:

1. A bidirectional Gray code counter, comprising:
a sequential logic element to store a Gray code value; and
logic circuitry to:
determine, based on a bidirectional indicator signal, whether to increment or decrement the Gray code value;
update, through performance of an increment or a decrement of the Gray code value based on the determination of whether to increment or decrement the Gray code value, the Gray code value to be a sequential Gray code value; and
replace the Gray code value stored in the sequential logic element with the updated Gray code value.

2. The bidirectional Gray code counter of claim 1, wherein, to update the Gray code value to be the sequential Gray code value, the logic circuitry is to maintain the Gray code value in Gray code format throughout the update.

3. The bidirectional Gray code counter of claim 1, wherein the logic circuitry is to further:
determine that the Gray code value stored in the sequential logic element is equal to a maximum Gray code value that can be represented by the bidirectional Gray code counter; and
prevent, based on the determination that the Gray code value is equal to the maximum Gray code value, the update, through the performance of the increment, of the Gray code value.

4. The bidirectional Gray code counter of claim 1, wherein the logic circuitry is to further:
determine that the Gray code value stored in the sequential logic element is equal to a minimum Gray code value that can be represented by the bidirectional Gray code counter; and
prevent, based on the determination that the Gray code value is equal to the minimum Gray code value, the update, through the performance of the decrement, of the Gray code value.

5. The bidirectional Gray code counter of claim 1, wherein, to update, through performance of the increment of the Gray code value, the Gray code value, the logic circuitry is to update a least significant bit of the Gray code value to be a logical inverse of a resultant value produced by performance of a logical exclusive-or operation on bits, within the Gray code value, of greater significance than the least significant bit.

6. The bidirectional Gray code counter of claim 1, wherein, to update, through performance of the increment of the Gray code value, the Gray code value, the logic circuitry is to:
determine whether a least significant bit of the Gray code value is a logical one or a logical zero; and
maintain, based on determination that the least significant bit is a logical zero, a value of a bit adjacent to the least significant bit.

7. The bidirectional Gray code counter of claim 1, wherein, to update, through performance of the increment of the Gray code value, the Gray code value, the logic circuitry is to:
determine whether a least significant bit of the Gray code value is a logical one or a logical zero; and
update, based on determination that the least significant bit is a logical one, a bit adjacent to the least significant bit to be a logical inverse of a resultant value produced by performance of a logical exclusive-or operation on bits, within the Gray code value, of greater significance than the bit adjacent to the least significant bit.

8. The bidirectional Gray code counter of claim 1, wherein, to update, through performance of the increment of the Gray code value, the Gray code value, the logic circuitry is to:
- determine, for an individual bit of the Gray code value that is not a least significant bit of the Gray code value and not adjacent to the least significant bit, whether an adjacent, less significant bit is a least significant logical one of the Gray code value; and
- if the adjacent, less significant bit is determined not to be the least significant logical one, maintain a value of the individual bit.

9. The bidirectional Gray code counter of claim 1, wherein, to update, through performance of the increment of the Gray code value, the Gray code value, the logic circuitry is to:
- determine, for an individual bit of the Gray code value that is not a least significant bit of the Gray code value and not adjacent to the least significant bit, whether an adjacent, less significant bit is a least significant logical one of the Gray code value; and
- if the adjacent, less significant bit is determined to be the least significant logical one, update the individual bit to be a logical inverse of a resultant value produced by performance of a logical exclusive-or operation on bits, within the Gray code value, of greater significance than the individual bit.

10. The bidirectional Gray code counter of claim 1, wherein, to update, through performance of the decrement of the Gray code value, the Gray code value, the logic circuitry is to update a least significant bit of the Gray code value to be a resultant value produced by performance of a logical exclusive-or operation on bits, within the Gray code value, of greater significance than the least significant bit.

11. The bidirectional Gray code counter of claim 1, wherein, to update, through performance of the decrement of the Gray code value, the Gray code value, the logic circuitry is to:
- determine whether a least significant bit of the Gray code value is a logical one or a logical zero; and
- if the least significant bit is determined to be the logical zero, maintain a value of a bit adjacent to the least significant bit.

12. The bidirectional Gray code counter of claim 1, wherein, to update, through performance of the decrement of the Gray code value, the Gray code value, the logic circuitry is to:
- determine whether a least significant bit of the Gray code value is a logical one or a logical zero; and
- if the least significant bit is determined to be a logical one, update a bit adjacent to the least significant bit to be a resultant value produced by performance of a logical exclusive-or operation on bits, within the Gray code value, of greater significance than the bit adjacent to the least significant bit.

13. The bidirectional Gray code counter of claim 1, wherein, to update, through performance of the decrement of the Gray code value, the Gray code value, the logic circuitry is to:
- determine, for an individual bit of the Gray code value that is not a least significant bit of the Gray code value and not adjacent to the least significant bit, whether an adjacent, less significant bit is a least significant logical one of the Gray code value; and
- if the adjacent, less significant bit is determined not to be the least significant logical one, maintain a value of the individual bit.

14. The bidirectional Gray code counter of claim 1, wherein, to update, through performance of the decrement of the Gray code value, the Gray code value, the logic circuitry is to:
- determine, for an individual bit of the Gray code value that is not a least significant bit of the Gray code value and not adjacent to the least significant bit, whether an adjacent, less significant bit is a least significant logical one of the Gray code value; and
- if the adjacent, less significant bit is determined to be the least significant logical one, update the individual bit to be a resultant value produced by performance of logical exclusive-or operation on bits, within the Gray code value, of greater significance than the individual bit.

15. An apparatus to bidirectionally count in Gray code, comprising:
- means to store a Gray code value;
- means to determine whether to perform an increment or a decrement of the Gray code value based on a bidirectional indicator signal, the Gray code value to a sequential Gray code value; and
- means to perform the increment or the decrement of the Gray code value, wherein the means to perform maintains the Gray code value in Gray code format throughout the performance of the increment or the decrement.

16. The apparatus of claim 15, further comprising:
- means to perform a logical exclusive-or operation on bits, within the Gray code value, of greater significance than a least significant bit within the Gray code value; and
- means to set the least significant bit of the Gray code value to be a logical inverse of a result of the logical exclusive-or operation.

17. The apparatus of claim 15, further comprising:
- means to determine whether a least significant bit of the Gray code value is a logical one or a logical zero;
- means to perform a logical exclusive-or operation on bits, within the Gray code value, of greater significance than a bit adjacent to the least significant bit; and
- means to set, based on determination that the least significant bit of is the logical one, the bit adjacent to the least significant bit to be a logical inverse of a result of the logical exclusive-or operation.

18. The apparatus of claim 15, further comprising:
- means to determine, for an individual bit of the Gray code value that is not a least significant bit of the Gray code value and not adjacent to the least significant bit, whether an adjacent, less significant bit is a least significant logical one of the Gray code value;
- means to perform a logical exclusive-or operation on bits, within the Gray code value, of greater significance than the individual bit; and
- means to set, based on determination that the adjacent, less significant bit is the least significant logical one, the individual bit to be a logical inverse of a result of the logical exclusive-or operation.

19. The apparatus of claim 15, further comprising:
- means to perform a logical exclusive-or operation on bits, within the Gray code value, of greater significance than a least significant bit of the Gray code value; and
- means to set the least significant bit to a result of the logical exclusive-or operation.

20. The apparatus of claim 15, further comprising:
- means to determine that a least significant bit of the Gray code value is a logical one;
- means to perform a logical exclusive-or operation on bits, within the Gray code value, of greater significance than a bit adjacent to the least significant bit; and means to set, based on determination that the least significant bit is a logical one, the bit adjacent to the least significant bit to be a result of the logical exclusive-or operation.

21. The apparatus of claim 15, further comprising:
means to determine, for an individual bit of the Gray code value that is not a least significant bit of the Gray code value and not adjacent to the least significant bit, that an adjacent, less significant bit is a least significant logical one of the Gray code value;
means to perform a logical exclusive-or operation on bits, within the Gray code value, of greater significance than the individual bit; and
means to set, based on determination that the adjacent, less significant bit is the least significant logical one, the individual bit to be a result of the logical exclusive-or operation.

22. A system to bidirectionally count in Gray code, comprising:
a sequential logic element to store a Gray code value;
one or more multiplexers coupled to the sequential logic element, the one or more multiplexers to update or maintain one or more bits of the Gray code value based on one or more select signals; and
logic circuitry coupled to the one or more multiplexers, the logic circuitry to:
determine a count direction based on a bidirectional indicator signal;
provide update values for each of the one or more bits to the one or more multiplexers based on the determined count direction; and
provide the one or more select values to the one or more multiplexers.

23. The system of claim 22, further comprising:
a processor that includes the sequential logic element, the one or more multiplexers, and the logic circuitry;
a network interface; and
one or more input/output ports of the network interface coupled to the processor.

24. The system of claim 22, wherein the logic circuitry includes one or more logical exclusive-or gates, each of the one or more logical exclusive-or gates coupled to a respective data input of a respective multiplexer from the one or more multiplexers, wherein each of the one or more logical exclusive-or gates is associated with a respective bit of the Gray code value, and wherein the logical exclusive-or gates are to:
receive the bidirectional indicator signal and a result of a logical exclusive-or operation applied to bits, within the Gray code value, of greater significance than the respective bit; and
output an update value to the respective data input.

25. The system of claim 22, wherein the logic circuitry includes one or more logical and gates, each of the one or more logical and gates coupled to a respective select input of a respective multiplexer from the one or more multiplexers, wherein each of the one or more logical and gates is associated with a respective bit of the Gray code value, and wherein the logical and gates are to:
receive an update signal, a value of an adjacent, less significant bit of the Gray code value to the respective bit and a result of a logical nand operation applied to bits, within the Gray code value, of less significance than the adjacent, less significant bit; and
output a select value to the respective select input that is to cause the respective multiplexer to update or maintain the respective bit based on the select value.

* * * * *